United States Patent
Shinohara

(10) Patent No.: US 8,183,604 B2
(45) Date of Patent: May 22, 2012

(54) SOLID STATE IMAGE PICKUP DEVICE INDUCING AN AMPLIFYING MOS TRANSISTOR HAVING PARTICULAR CONDUCTIVITY TYPE SEMICONDUCTOR LAYERS, AND CAMERA USING THE SAME DEVICE

(75) Inventor: Mahito Shinohara, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 854 days.

(21) Appl. No.: 11/832,329

(22) Filed: Aug. 1, 2007

(65) Prior Publication Data

US 2007/0278544 A1    Dec. 6, 2007

Related U.S. Application Data

(62) Division of application No. 10/901,167, filed on Jul. 29, 2004, now Pat. No. 7,382,009.

(30) Foreign Application Priority Data

Aug. 7, 2003  (JP) .................................. 2003-288939

(51) Int. Cl.
*H01L 31/062* (2006.01)
(52) U.S. Cl. ........................ 257/233; 257/292
(58) Field of Classification Search .......... 257/290–292, 257/233, 234, 258
See application file for complete search history.

(56) References Cited

U.S. PATENT DOCUMENTS

| | | | | |
|---|---|---|---|---|
| 5,192,990 A | * | 3/1993 | Stevens ........................ | 257/229 |
| 5,408,113 A | | 4/1995 | Kanno et al. .................. | 257/292 |
| 5,625,210 A | | 4/1997 | Lee et al. ...................... | 257/292 |
| 5,861,620 A | | 1/1999 | Takahashi et al. ......... | 250/208.1 |
| 5,880,495 A | | 3/1999 | Chen ............................... | 257/233 |
| 5,933,188 A | | 8/1999 | Shinohara et al. ............. | 348/302 |
| 6,023,081 A | | 2/2000 | Drowley et al. ............... | 257/292 |
| 6,218,691 B1 | | 4/2001 | Chung et al. .................. | 257/290 |
| 6,281,531 B1 | | 8/2001 | Kamashita et al. ........... | 257/258 |

(Continued)

FOREIGN PATENT DOCUMENTS

EP    1 376 701 A2    1/2004

(Continued)

OTHER PUBLICATIONS

Foreign Official Communication dated Apr. 6, 2007, regarding Foreign Counterpart Application 2004100562397. European Official Communication and Search Report dated Apr. 8, 2008, regarding Counterpart Application 04018632.2-2203.

*Primary Examiner* — Bradley K Smith
(74) *Attorney, Agent, or Firm* — Fitzpatrick, Cella, Harper & Scinto

(57) ABSTRACT

To provide an amplification type solid state image pickup device enabling lower noise, higher gain, and higher sensitivity than any conventional amplification type solid state image pickup device. A solid state image pickup device according to the present invention includes an arrangement of a plurality of unit pixels each of which includes at least: a photodiode for accumulating a signal charge generated by an incident light; and an amplifying MOS transistor receiving the signal charge at a control electrode, amplifying the signal charge and outputting an amplified signal, wherein: the amplifying MOS transistor is formed in a first semiconductor layer of a first conductivity type which is the same conductivity type as source and drain of the amplifying MOS transistor, the first semiconductor layer has an impurity concentration lower than that of the source and drain, and the first semiconductor layer is depleted between the source and drain at least during an amplifying operation of the amplifying MOS transistor.

10 Claims, 4 Drawing Sheets

U.S. PATENT DOCUMENTS

| | | | |
|---|---|---|---|
| 6,403,998 B1 | 6/2002 | Inoue | 257/292 |
| 6,504,193 B1 | 1/2003 | Ishiwata et al. | 257/291 |
| 6,521,920 B2 * | 2/2003 | Abe | 257/223 |
| 6,649,948 B2 | 11/2003 | Inoue | 257/292 |
| 6,885,047 B2 | 4/2005 | Shinohara et al. | 257/292 |
| 2002/0125513 A1 | 9/2002 | Inoue | 257/291 |
| 2002/0175355 A1 | 11/2002 | Shim | 257/290 |
| 2005/0040446 A1 | 2/2005 | Shinohara | 257/292 |

FOREIGN PATENT DOCUMENTS

| | | |
|---|---|---|
| JP | 11-196331 | 7/1999 |
| JP | 11-233747 | 8/1999 |
| JP | 11-284166 | 10/1999 |
| JP | 2000-91551 | 3/2000 |
| JP | 2000-150848 | 5/2000 |

\* cited by examiner

SOLID STATE IMAGE PICKUP DEVICE INDUCING AN AMPLIFYING MOS TRANSISTOR HAVING PARTICULAR CONDUCTIVITY TYPE SEMICONDUCTOR LAYERS, AND CAMERA USING THE SAME DEVICE

This application is a division of application Ser. No. 10/901,167, filed on Jul. 29, 2004.

This application claims priority from Japanese Patent Application No. 2003-288939 filed Aug. 7, 2003, which is hereby incorporated by reference herein.

BACKGROUND OF THE INVENTION

1. Field of the Invention

The preset invention relates to a solid state image pickup device and a camera provided with a solid state image pickup device.

2. Related Background Art

Up to now, CCDs have been widely employed as solid state image pickup devices because of their high SN ratios. Meanwhile, development of a so-called amplification type solid state image pickup device is under way, the device excelling in low power consumption and high usability. The amplification type solid state image pickup device is configured such that signal charges accumulated in a photodiode are introduced to a control electrode of a transistor in each pixel and an electric signal according to a signal charge amount is amplified and output from a main electrode of the transistor. In particular, a so-called CMOS sensor employing a MOS transistor as a transistor well matches a CMOS process and enables on-chip driver circuit and signal processing circuit. Accordingly, development of the CMOS sensor is being eagerly pursued.

FIG. 5 is a circuit diagram showing a typical example of a CMOS sensor pixel. In FIG. 5, reference numeral 1 denotes a unit pixel; 2, a photodiode for accumulating signal charges generated due to incident light; 3, an amplifying MOS transistor for outputting an amplified signal according to a signal charge amount; 4, a floating diffusion (hereinafter, referred to as "FD") region receiving the signal charges and connected with a gate electrode of the amplifying MOS transistor 3; 5, a MOS transistor for transferring the signal charges accumulated in the photodiode 2 to the FD region 4; 6, a resetting MOS transistor for resetting the FD region 4; 7, a selecting MOS transistor for selecting an output pixel; 8, a control line for applying pulses to a gate of the MOS transistor 5 and controlling a charge transferring operation; 9, a control line for applying pulses to a gate of the resetting MOS transistor 6 and controlling a resetting operation; 10, a control line for applying pulses to a gate of the selecting MOS transistor 7 and controlling a selecting operation; 11, a power supply line connected to a drain of the amplifying MOS transistor 3 and a drain of the resetting MOS transistor 6 and supplying a power supply potential to the transistors; 12, an output line to which an amplified signal of the selected pixel is output; 13, a constant-current MOS transistor operating as a constant current source and constituting a source follower in corporation with the amplifying MOS transistor 3; and 14, a wiring for supplying to a gate electrode of the constant-current MOS transistor 13 such a potential as allows for a constant-current operation of the constant-current MOS transistor 13. The unit pixels 1 are two-dimensionally arranged in a matrix shape to constitute a pixel region of a two-dimensional solid state image pickup device. In such matrix arrangement, the output line 12 serves as a common line for pixels in respective columns, and the control lines 8, 9, and 10 serve as common lines for pixels in respective rows. Signals from the pixels in a row selected by the control line 10 are only output to the output line 12.

Next, an operation of the pixel is explained in brief. For the pixels in the row where the selecting MOS transistor is turned ON by the control line 10, a pulse is first applied to the control line 9 to reset the FD region 4. The amplifying MOS transistor 3 and the constant-current MOS transistor 13 constitute a source follower. Thus, an output potential according to a reset potential appears in the output line 12. Next, when the signal charges accumulated in the photodiode are transferred to the FD region 4 by applying a pulse to the control line 8, a potential of the FD region 4 changes by a voltage according to the signal charge amount. The potential change is reflected in the output line 12. The reset potential appearing in the output line 12 involves a threshold voltage variation of the amplifying MOS transistor 3, and noise such as reset noise generated in resetting the FD region 4. In light of this, the potential change according to the signal charge amount corresponds to a noise-free signal. In the two-dimensional CMOS sensor, the output line 12 is connected with a read-out circuit for eliminating the noise and taking out only a signal. With regard to the read-out circuit, some structures are proposed including one where the noise is eliminated with a clamp circuit, and one where the noise is eliminated by separately holding noise and (noise+pure signal), and introducing each to a differential amplifier at the final stage during horizontal scanning (reading). However, such structures do not directly relate to the present invention, and hence a detailed description thereof is omitted here.

Next, a sectional structure of a portion corresponding to the photodiode and amplifying MOS transistor of the pixel is shown in FIG. 6. In FIG. 6, reference numeral 15 denotes an N-type semiconductor substrate; 16, a P-type well; and 17, an N-type semiconductor region which is formed in the P-type well 16, constitutes a photodiode together with the P-type well 16, and accumulates signal charges generated due to incident light. Denoted by 18 and 19 are N-type semiconductor regions formed in the P-type well 16 and serving as a drain and source of the amplifying MOS transistor 3, respectively. Reference numeral 20 denotes a gate electrode of the amplifying MOS transistor 3; 21, a thick oxide film for element isolation, that is, so-called LOCOS; 22, a channel stopper made from a P-type semiconductor layer with the same conductivity type as that of the P-type well 16 and formed directly below the LOCOS 21; 11, a drain wiring connected with the drain 18; and 23, a source wiring connected with the source 19. The signal charges accumulated in the N-type semiconductor region 17 are transferred to the FD region 4 during a transferring operation. An N-type impurity concentration in the N-type semiconductor region 17 is set so as to turn the region into a depletion region just after the transfer.

Japanese Patent Application Laid-open No. 2000-150848 (FIG. 7) discloses a solid state image pickup device where a p-type buried layer is formed at a predetermined depth in an n-type substrate. A photoelectric conversion part is formed in a upper portion of the n-type substrate about the p-type buried layer.

However, the aforementioned conventional CMOS sensor encounters a problem in that so-called 1/f noise is generated from the amplifying MOS transistor 3 to increase a noise level in the entire sensor. Also, in general, the amplifying MOS transistor 3 is operated as a source follower, but the following problem arises here. That is, a potential of the P-type well 16 is set to a fixed value, which drops a gain at the time of source follower operation due to a back gate bias effect, lowering a signal level. The signal charges generated downstream of the photodiode are not always absorbed in the photodiode but are likely to be absorbed in the FD region 4 and the N-type source/drain of the amplifying MOS transistor 3, the resetting MOS transistor 6, and the selecting MOS transistor 7 in the pixels in a certain probability. As discussed above, there is a problem in that the signal charges are absorbed in components except the photodiode, resulting in low sensitivity.

Also, in the pixel structure as disclosed in Japanese Patent Application Laid-Open No. 2000-150848, an amplifying MOS transistor provided in a pixel is formed in a well whose conductivity type is opposite to that of its source/drain. Hence, it is impossible to form a depletion region below a channel formation region unlike the present invention nor to minimize a substrate bias effect to a satisfactory level. Accordingly, the 1/f noise cannot be sufficiently reduced, and the gain of the source follower cannot be designed to be up.

SUMMARY OF THE INVENTION

The present invention therefore has an object to provide an amplification type solid state image pickup device enabling lower noise, higher gain, and higher sensitivity than amplification type conventional solid state image pickup devices.

In order to solve the above-mentioned problems inherent in a conventional CMOS sensor, a photodiode for accumulating a signal charge generated by an incident light; and an amplifying MOS transistor receiving the signal charge at a control electrode, amplifying the signal charge and outputting an amplified signal, wherein:

the amplifying MOS transistor is formed in a first semiconductor layer of a first conductivity type which is the same conductivity type as source and drain of the amplifying MOS transistor, the first semiconductor layer has an impurity concentration lower than that of the source and drain, and the first semiconductor layer is depleted between the source and drain at least during an amplifying operation of the amplifying MOS transistor.

Further, a CMOS sensor pixel according to the present invention has a structure in which: a first P-type layer is formed in the depths of a semiconductor and a first N-type semiconductor layer with a low impurity concentration is formed above the first P-type layer; a second N-type semiconductor layer for accumulating signal charges and an N-type MOS transistor constituting a pixel are formed in the first N-type semiconductor layer; and a second P-type semiconductor layer is formed in a deeper position than source/drain regions of the N-type MOS transistor so as to extend throughout at least a gate of the N-type MOS transistor.

At this time, a semiconductor formed in a portion from just below at least the gate of the amplifying MOS transistor to the second P-type semiconductor layer includes: the first N-type semiconductor layer, or a third N-type semiconductor layer introduced into a portion around a semiconductor interface just below the gate, and the first N-type semiconductor. The first N-type semiconductor layer with a lower impurity concentration is formed between a channel of the amplifying MOS transistor and the second P-type semiconductor layer and turned into a depletion layer when the amplifying MOS transistor operates as a source follower and the source is reversely biased with respect to a potential of the second P-type semiconductor layer. The formation of the depletion layer with a predetermined width reduces a capacitance between the channel of the amplifying MOS transistor and the second P-type semiconductor layer. As a result, a variation in threshold voltage of the amplifying MOS transistor due to a substrate bias effect is minimized to thereby suppress a gain drop during the source follower operation. Also, minimizing the substrate bias effect makes it possible to weaken an effect of forcing carriers moving in the channel of the amplifying MOS transistor into an interface and to minimize a 1/f noise generated during the source follower operation. Further, the second P-type semiconductor layer functions as a potential barrier as well, which keeps the signal charges generated due to an incident light from being absorbed into the source/drain of the N-type MOS transistor around the photodiode. Hence, more signal charges can be absorbed in the photodiode to improve sensitivity.

According to a first aspect of the present invention, it is possible to provide a CMOS type solid state image pickup device enabling lower noise, higher gain, and higher sensitivity.

Also, according to a second aspect of the present invention, in addition to effects of the first embodiment, a low-cost CMOS type solid state image pickup device can be provided.

Also, according to a third aspect of the present invention, a camera for taking a video image can be provided.

DESCRIPTION OF THE PREFERRED EMBODIMENTS

First Embodiment

Figure 1:
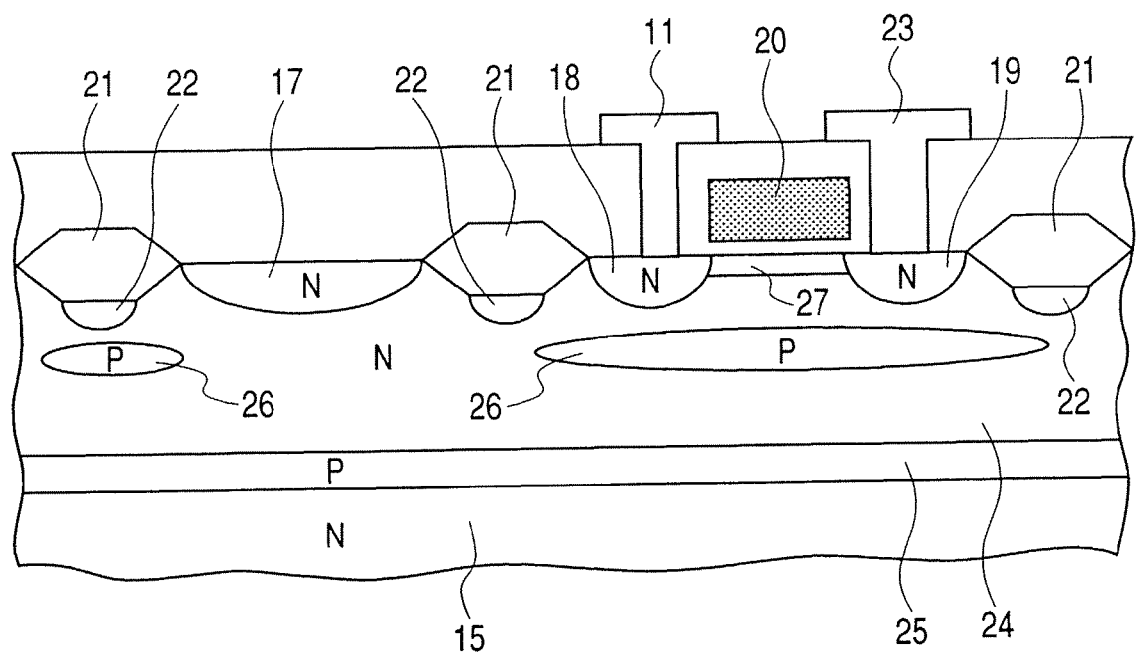
FIG. 1 is a sectional structural view of a pixel for explaining a first embodiment of the present invention.
Figure 5:
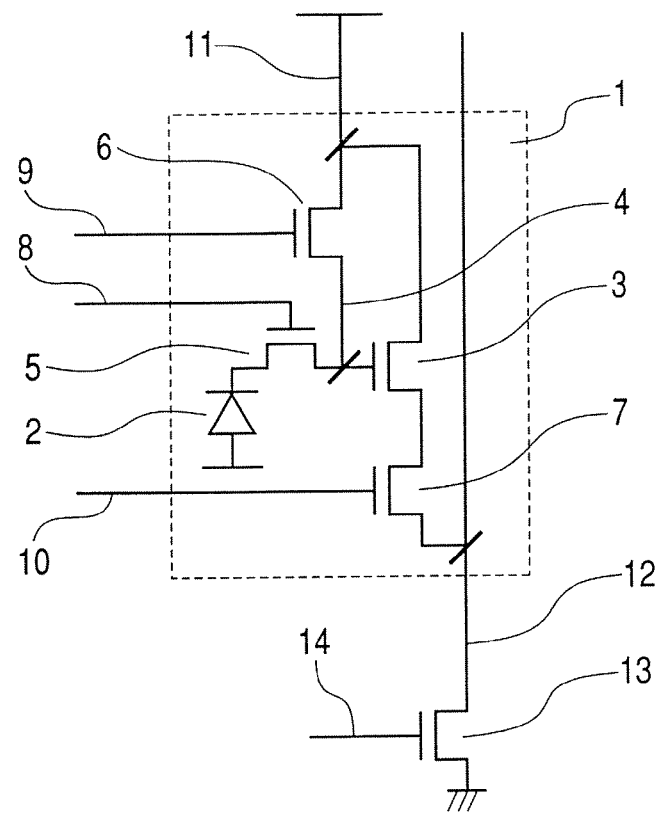
FIG. 5 is a circuit diagram of a conventional pixel.
Figure 6:
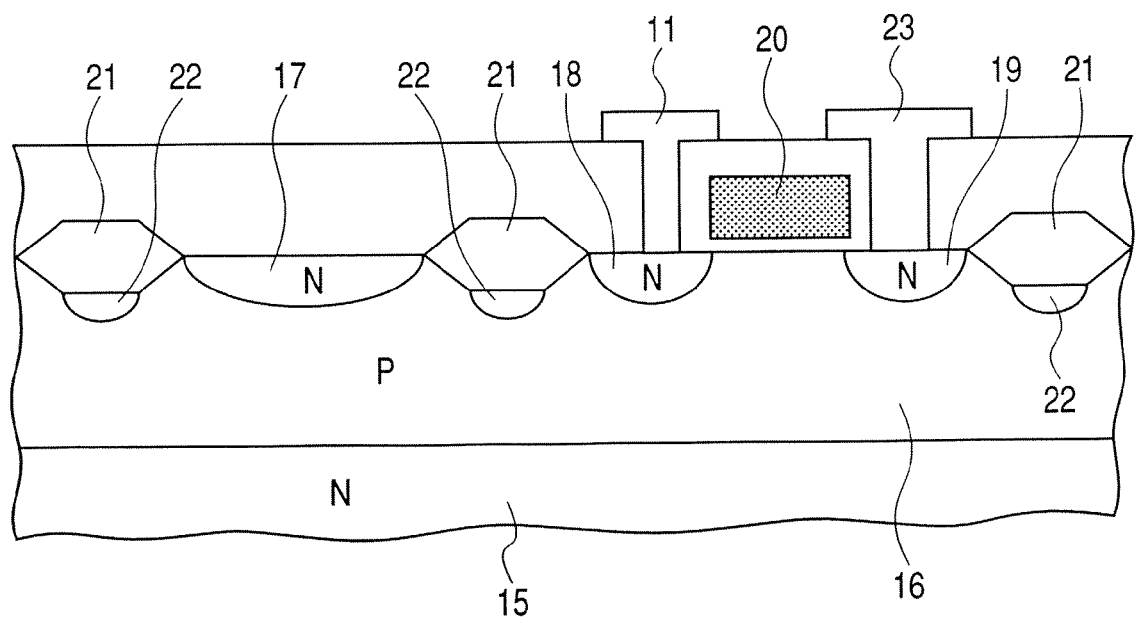
FIG. 6 is a sectional structural view of the conventional pixel.

FIG. 1 is a structural view showing a part of a pixel most representative of a characteristic of the present invention and showing a sectional structure of a photodiode, an amplifying MOS transistor, and an element isolation portion. In FIG. 1, the same components as those of FIGS. 5 and 6 are denoted by the same reference symbols and a detailed description thereof is omitted. In FIG. 1, denoted by 24 is an N-type well (N-type semiconductor layer) or an upper layer portion of an N-type substrate 15. Denoted by 25 is a P-type semiconductor layer sandwiched between the N-type substrate 15 and the N-type semiconductor layer 24. The N-type semiconductor layer 24 and the P-type semiconductor layer 25 constitute a photodiode. An impurity concentration of an N-type layer (N-type semiconductor region) 17 is set higher than that of the N-type semiconductor layer 24. Signal charges are gathered in the N-type layer 17. A P-type semiconductor layer 26 is formed just below at least a gate region of the N-type MOS transistor in the pixel, in a deeper position than source/drain of the transistor. Reference numeral 27 denotes an N-type semiconductor layer with an impurity concentration higher than that of the N-type semiconductor layer 24, which is formed at a channel region of an amplifying MOS transistor 3. Note that the P-type semiconductor layer 26 is also formed just below at least part of the source/drain regions for electrically isolating between the N-type semiconductor layer 24 (N-type semiconductor) constituting the photodiode, and the source/drain regions of the N-type MOS transistor in the pixel.

Figure 2:
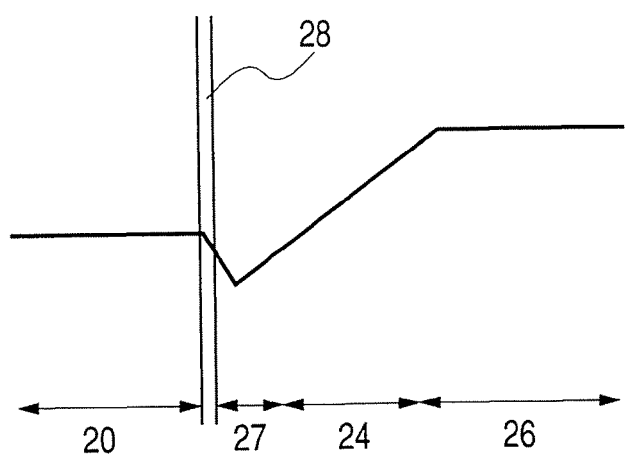
FIG. 2 is a potential chart at the time of pixel operation for explaining the first embodiment of the present invention.

Referring to FIG. 1, a description is given of a potential change during the operation of the amplifying MOS transistor 3 in the pixel structure of FIG. 1. FIG. 2 shows a potential in a depth direction inclusive of a gate of the amplifying MOS transistor 3. The horizontal axis direction corresponds to the depth direction, and the vertical axis direction corresponds to a potential; the potential becomes higher toward a lower portion of FIG. 2. Reference numerals assigned for representing the respective positions are the same as those of FIG. 1. Reference numeral 28 denotes a gate oxide film. At the time of the source follower operation of the amplifying MOS transistor 3, provided that there is no influence of a fixed charge in the gate oxide film 28, a potential relationship of respective portions constituting the amplifying MOS transistor 3 is as follows: a drain 18>a source 19>the P-type semiconductor layer 26. If a source potential is higher than a gate potential, however, a potential of the channel region where carriers move is higher than that of the gate. As shown in FIG. 2, the maximum (peak) potential in the channel region is thus observed in a silicon inner portion somewhat deeper than a silicon interface. Then, a so-called buried channel is formed. The channel (N-type semiconductor layer) 27 and the P-type semiconductor layer 26 are reversely biased. In the present invention, the N-type semiconductor layer 24 with a low impurity concentration between the P-type semiconductor layer 26 and the channel 27 is turned into a depletion layer. Hence, as compared with a case where a channel is formed in a P-type semiconductor layer, a capacitance between the channel and the P-type semiconductor substrate, that is, between the channel and the P-type semiconductor layer 26 of FIG. 2 can be reduced, by which a substrate bias effect is sufficiently minimized. Even if the reverse bias is applied as mentioned above, an effect of forcing electrons in the channel into the interface is small to thereby enable the buried channel state as shown in FIG. 1.

A specific structural example is given here. The impurity concentration of the N-type semiconductor layer (N-type silicon semiconductor region) 24 is $10^{15}/cm^3$. A junction depth of the drain 18 and the source 19 of the amplifying MOS transistor 3 is 0.4 µm. The P-type semiconductor layer 26 is formed such that the junction depth on the interface side is 1.0 µm from the semiconductor interface and the impurity concentration peak appears at a depth of 1.2 µm. The N-type semiconductor layer 27 is formed to have an impurity concentration of $2 \times 10^{16}/cm^3$ and a junction depth of 0.2 µm. The gate oxide film formed from a silicon oxide film has a thickness of 150 Å. Provided that the potential of the P-type semiconductor layer 26 is 0 V and the source potential is 1 V or higher during the source follower operation of the amplifying MOS transistor 3, the N-type semiconductor layer (semiconductor region) 24 between the N-type semiconductor layer 27 where the channel is formed and the P-type semiconductor layer 26 is turned into a depletion region. At this time, the capacitance between the N-type semiconductor layer 27 and the P-type semiconductor layer 26 is reduced to about 1/17 of a gate oxide film capacitance and is thus negligible. Next, if there is no influence of the fixed charge in the gate oxide film, the N-type semiconductor layer 27 is turned into a depletion layer at the time when its potential is about 1 V higher than a potential of a gate electrode 20. To that end, in the source follower operation where the current flows in the channel formed in the N-type semiconductor layer 27, the source potential is kept 0.7 V higher than the potential of the gate electrode 20, for example. The channel is formed at this point in the N-type semiconductor layer 27 deeper than the silicon interface. If the potential of the gate electrode 20 is not lower than 0.3 V, the source potential reaches 1 V or higher. The N-type semiconductor layer (semiconductor region) 24 between the N-type semiconductor layer 27 where the channel is formed and the P-type semiconductor layer 26 is turned into a depletion region. Thus, the source follow operation is realized where the influence of the back gate bias effect is suppressed. Even if the potential of the gate electrode 20 varies, the variation does not affect a relationship with the channel potential and the channel depth so much.

In such a buried channel MOS transistor, an influence of trap, which is existent in the interface, on channel electrons is minimized, and therefore the 1/f noise can be more reduced than in a surface channel MOS transistor. Also, suppressing the back gate effect realizes a low dependency on a source potential of a threshold potential of the amplifying MOS transistor and improves the gain at the time of the source follower operation. Further, the P-type semiconductor layer 26 is formed below the source/drain of the MOS transistor in the pixel as well, and hence functions as a potential barrier for the signal charges generated in the N-type semiconductor layer 24 due to the incident light. Thus, the signal charges can be kept from being absorbed in the source/drain of the MOS transistor. Accordingly, the light-generation charges are more likely to be absorbed in the N-type layer (charge accumulating layer) 17 of the photodiode portion, which enhances the sensitivity. Therefore, it is possible to provide a CMOS type solid state image pickup device enabling lower noise, higher gain, and higher sensitivity than any conventional CMOS type solid state image pickup device.

Second Embodiment

Figure 3:
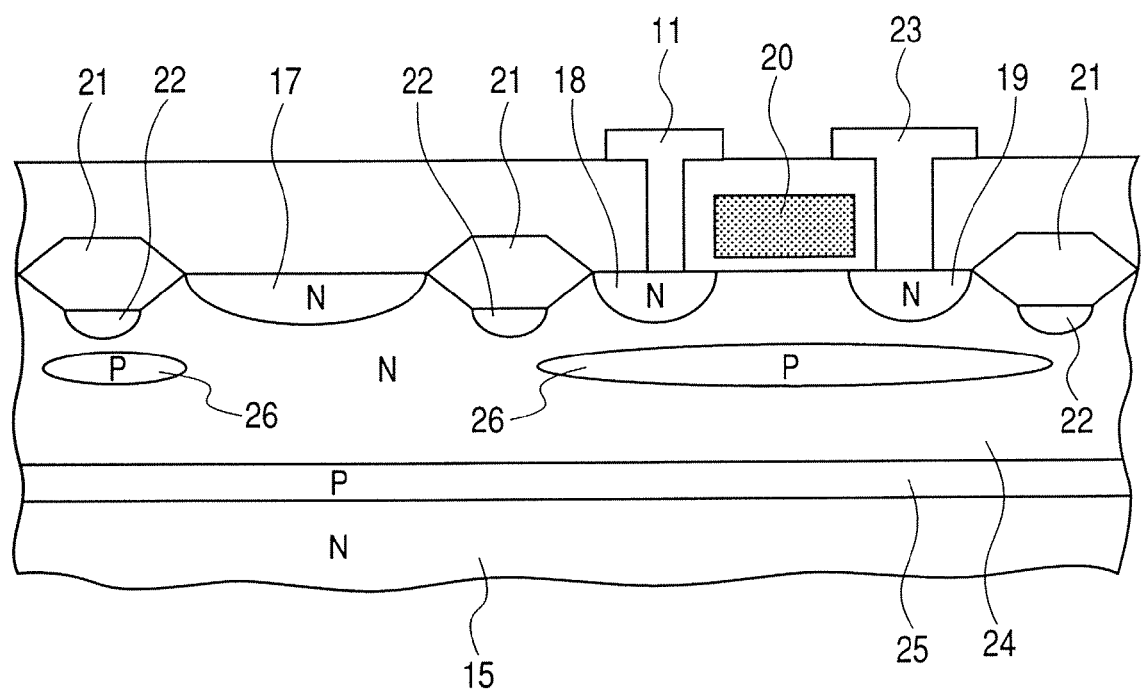
FIG. 3 is a sectional structural view of a pixel for explaining a second embodiment of the present invention.

FIG. 3 is a sectional view of a pixel for explaining a second embodiment of the present invention. In FIG. 3, the same components as those of FIG. 1 are denoted by the same reference symbols except that the N-type semiconductor layer 27 of FIG. 1 is not shown in FIG. 3. Thus, the channel formed in the amplifying MOS transistor at the time of the source follower operation is buried to a small depth as compared with the first embodiment, which looks like the surface channel rather than the buried channel. However, impurity ions are not implanted into the channel region. Hence, there are few defects in the channel and the silicon interface which cause the 1/f noise. Also, similarly to the first embodiment, the substrate bias effect is suppressed. The 1/f noise is smaller and the gain at the time of the source follower operation is higher than those of an N-type MOS transistor with an ordinary structure formed in a P-type semiconductor layer. The photodiode sensitivity is high as in the first embodiment; a manufacturing process includes no step of forming the N-type semiconductor layer 27. This makes it possible to provide at lower cost the CMOS type solid state image pickup device to which this embodiment is applied.

As has been described so far, in the MOS transistors except the amplifying MOS transistor of the first embodiment and the second embodiment, it is possible to employ either a structure where a P-type semiconductor layer is formed through impurity introduction into the N-type semiconductor layer 24 extending from the silicon interface just below the gate, to the P-type semiconductor layer 26 in light of improving a breakdown voltage between the source and the drain or the same structure as that of the amplifying MOS transistor. Also, the P-type semiconductor layer 26 of the first embodiment and the second embodiment has a single-layer structure. One or more P-type semiconductor layers may be formed between the P-type semiconductor layer 25 and the P-type semiconductor layer 26 to more securely establish an electrical continuity between the P-type semiconductor layer 25 and the P-type semiconductor layer 26 instead. Also, a so-called buried photodiode may be used, where a P-type semiconductor layer is formed at a semiconductor interface portion of the N-type layer 17 in which the signal charges are accumulated.

Note that in the above description of the present invention, the polarities (N-type and P-type) of all the portions may be reversed.

Third Embodiment

Figure 4:
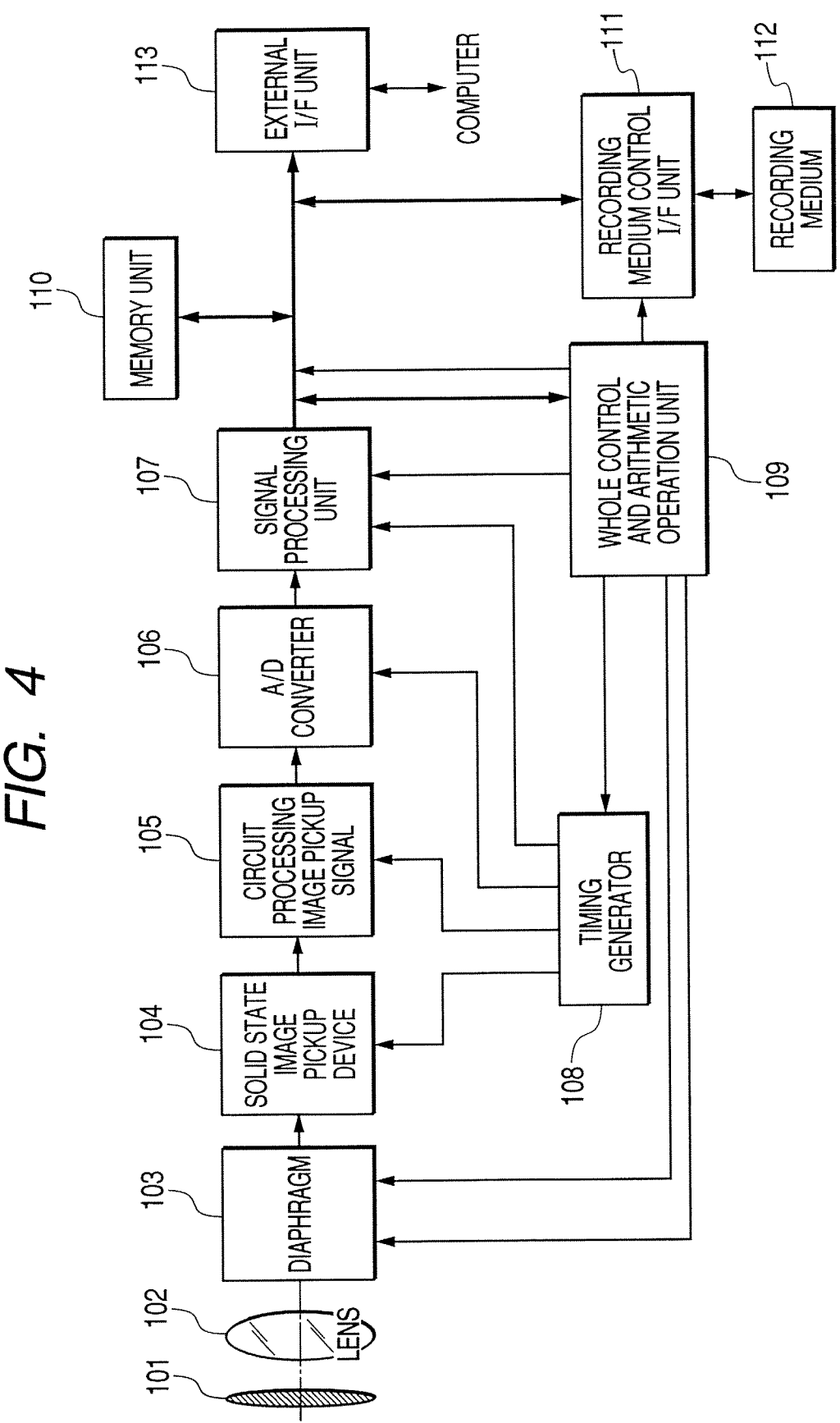
FIG. 4 is a block diagram showing a structure of a still video camera according to a third embodiment of the present invention.

Referring to FIG. 4, a detailed description is given of an embodiment where the solid state image pickup device according to the present invention is applied to a still video camera.

FIG. 4 is a block diagram showing a case where the solid state image pickup device according to the present invention is applied to the "still video camera".

In FIG. 4, reference numeral 101 denotes a barrier serving as both a protect and a main switch of a lens; 102, a lens for focusing an optical image of an object on a solid state image pickup element (solid state image pickup device) 104; 103, a diaphragm for varying an amount of light passing through the lens 102; 104, the solid state image pickup element for capturing (picking up) the object image focused with the lens 102 as an image signal; 106, an A/D converter for analog-to-digital conversion of the image signal output from the solid state image pickup element 104; 107, a signal processing unit for applying various corrections or data compression to image data output from the A/D converter 106; 108, a timing generator for outputting various timing signals to the solid state image pickup element 104, a circuit processing image pickup signal 105, the A/D converter 106, and the signal processing unit 107; 109, a whole control and arithmetic operation unit for performing various arithmetic operations and controlling the whole still video camera; 110, a memory unit for temporarily storing the image data; 111, a recording medium control interface (I/F) unit for recording or reading on/from a recording medium; 112, a detachably connectable recording medium for recording or reading the image data such as a semiconductor memory; and 113, an interface for communicating with an external computer etc.

Next, a description is given of an operation of the still video camera in the above structure during photographing. The barrier 101 is opened to first turn on a main power, next turn on power for a control system, and then turn on power for an image pickup system including the A/D converter 106.

Subsequently, the whole control and arithmetic operation unit 109 opens the diaphragm 103 for controlling an exposure amount, and a signal output from the solid state image pickup element 104 is converted by the A/D converter 106 and then input to the signal processing unit 107.

The whole control and arithmetic operation unit 109 performs an arithmetic operation regarding the exposure based on the obtained data.

A speed is judged from the photometric result and the whole control and arithmetic operation unit 109 controls the diaphragm based on the obtained result.

Next, the whole control and arithmetic operation unit 109 carries out an arithmetic operation of a distance to an object after extracting an RF component based on the signal output from the solid state image pickup element 104. After that, the lens is driven and judged for whether or not being focused. If judged as not focused, the lens is redriven for measuring the distance.

Then, regular exposure starts after the focused state is confirmed.

The image signal output from the solid state image pickup element 104 receives an A/D conversion with the A/D converter 106 upon the completion of the exposure, and written to the memory unit with the whole control and arithmetic operation unit 109 through the signal processing unit 107.

After that, the data stored in the memory unit 110 is recorded on the detachably connectable recording medium 112 such as a semiconductor memory through the recording medium control I/F unit under the control of the whole control and arithmetic operation unit 109.

Also, it may be directly input to the computer etc. through the external I/F unit 113 for image processing.

The present invention is applicable to a camera for taking a video image.

What is claimed is:

1. A solid state image pickup device, comprising:
a plurality of photodiodes, each including a semiconductor region of a first conductivity type for accumulating a signal charge generated by incident light; and
a plurality of amplifying MOS transistors, each for receiving a signal from the photodiode at a gate electrode thereof,
wherein:
each amplifying MOS transistor has a source region and a drain region of the first conductivity type in a first semiconductor region of the first conductivity type, the source region and the drain region of the amplifying MOS transistor being separate from the semiconductor regions of the plurality of photodiodes, and
for each amplifying MOS transistor, the first semiconductor region has an impurity concentration lower than that of the source region and the drain region,
and the device further comprising a second semiconductor region of a second conductivity type opposite to the first conductivity type at least under the gate electrode of the amplifying MOS transistor, and
a third semiconductor region of the first conductivity type having an impurity concentration higher than that of the first semiconductor region formed at a channel region of the amplifying MOS transistor, and
each amplifying MOS transistor is a buried channel MOS transistor.

2. The solid state image pickup device according to claim 1, wherein the first semiconductor region has a lower impurity concentration than that of the source region and the drain region so as to be depleted between the third semiconductor region and the second semiconductor region by a gate voltage forming the channel region.

3. The solid state image pickup device according to claim 1, wherein the second semiconductor region is arranged at least under the source region and the drain region.

4. The solid state image pickup device according to claim 1, wherein each photodiode includes the first semiconductor region and a fourth semiconductor region of the second conductivity type arranged under the first semiconductor region.

5. The solid state image pickup device according to claim 4, wherein the semiconductor region of the first conductivity type has an impurity concentration higher than that of the first semiconductor region.

6. The solid state image pickup device according to claim 4, wherein the fourth semiconductor region extends under a corresponding amplifying MOS transistor.

7. The solid state image pickup device according to claim 1, wherein, for each photodiode, an element isolation region is arranged between the semiconductor region of the first conductivity type and the amplifying MOS transistor.

8. The solid state image pickup device according to claim 4, wherein the fourth semiconductor region extends under a corresponding amplifying MOS transistor.

9. A solid state image pickup device, comprising:
- a photodiode including a first semiconductor region of a first conductivity type, a second semiconductor region of the first conductivity type, and a third semiconductor region of a second conductivity type, wherein the first, second, and third semiconductor regions are arranged along a depth direction in this order;
- an amplifying transistor including a gate electrode, a source region and a drain region arranged at a part of the second semiconductor region,
- a fourth semiconductor region of the second conductivity type under the gate electrode, and
- a fifth semiconductor region of the first conductivity type between the fourth semiconductor region and the gate electrode,
- wherein the amplifying transistor is a buried-type transistor.

10. The solid state image pickup device according to claim 1, wherein a portion of the second semiconductor region arranged under the gate electrode of the amplifying MOS transistor is deeper than the source region and the drain region of the amplifying MOS transistor.

* * * * *